United States Patent
Bassom

(10) Patent No.: US 7,723,699 B2
(45) Date of Patent: May 25, 2010

(54) CATHODE HAVING ELECTRON PRODUCTION AND FOCUSING GROOVES, ION SOURCE AND RELATED METHOD

(75) Inventor: Neil J. Bassom, Hamilton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 407 days.

(21) Appl. No.: 11/768,242

(22) Filed: Jun. 26, 2007

(65) Prior Publication Data

US 2009/0001281 A1    Jan. 1, 2009

(51) Int. Cl.
*H01J 37/08* (2006.01)
(52) U.S. Cl. ............ 250/423 R; 250/427; 250/423 F; 250/492.21
(58) Field of Classification Search ............. 250/423 R, 250/427, 423 F, 492.21
See application file for complete search history.

(56) References Cited

U.S. PATENT DOCUMENTS

| | | | | |
|---|---|---|---|---|
| 3,594,885 A | * | 7/1971 | Miram et al. | 445/47 |
| 5,703,372 A | * | 12/1997 | Horsky et al. | 250/423 R |
| 5,703,375 A | | 12/1997 | Chen et al. | |
| 6,936,145 B2 | * | 8/2005 | Sunthankar et al. | 204/298.41 |

FOREIGN PATENT DOCUMENTS

| | | |
|---|---|---|
| JP | 10199430 A | 7/1998 |
| JP | 2001283745 A | 10/2001 |

* cited by examiner

*Primary Examiner*—Kiet T Nguyen

(57) ABSTRACT

A cathode having electron production and focusing grooves for an ion source of an ion implanter system, the ion source and a related method are disclosed. In one embodiment, the cathode includes a working surface having a plurality of electron production and focusing grooves positioned therein. A repeller of the ion source may be similarly structured.

20 Claims, 5 Drawing Sheets

CATHODE HAVING ELECTRON PRODUCTION AND FOCUSING GROOVES, ION SOURCE AND RELATED METHOD

BACKGROUND

1. Technical Field

The disclosure relates generally to ion implantation, and more particularly, to a cathode having electron production and focusing grooves for an ion source of an ion implanter, the ion source and a related method.

2. Background Art

A cathode and a repeller are positioned within an ion source of an ion implanter to generate an ion plasma by injecting electrons into a source gas. The repeller is at the same potential as the cathode but is not heated—its purpose is to prevent electrons escaping the plasma by reflecting them back into the plasma. When installed, the cathode and repeller both present a substantially planar working surface to the source gas. However, as the ion source is used, their working surfaces erode to have a concave surface, especially that of the cathode. The concave surface acts to increase the output of the ion source, particularly as the cathode approaches the end of its useful life. In particular, the concave surface of the cathode focuses the thermionic electrons in a central region of the plasma, which increases output. Unfortunately, the duration of the increased output is limited due to the cathode reaching the end of its useful life.

One approach to take advantage of the increased output is to build a cathode having a concave surface. This approach, however, is not tenable for a number of reasons. First, the concave surface cathode may reduce the lifetime of the cathode due to the thinner center. Typically, failure occurs at the center of the cathode. Furthermore, the concave surface cathode may require structure that presents a higher thermal mass, which is difficult to heat and control, e.g., if the edges of the cathode surface are thicker.

SUMMARY

A cathode having electron production and focusing grooves for an ion source of an ion implanter system, the ion source and a related method are disclosed. In one embodiment, the cathode includes a working surface having a plurality of electron production and focusing grooves positioned therein. A repeller of the ion source may be similarly structured.

A first aspect of the disclosure provides a cathode for an ion source of an ion implanter, the cathode comprising: a working surface having a plurality of electron production and focusing grooves positioned therein.

A second aspect of the disclosure provides an ion source for an ion implanter, the ion source comprising: a source gas inlet; a cathode comprising a working surface having a plurality of electron production and focusing grooves positioned therein; and an ion plasma outlet.

A third aspect of the disclosure provides a method of generating an ion plasma, the method comprising: providing a source gas; applying a bias on a cathode adjacent to the source gas to generate the ion plasma, the cathode comprising a working surface having a plurality of electron production and focusing grooves positioned therein.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
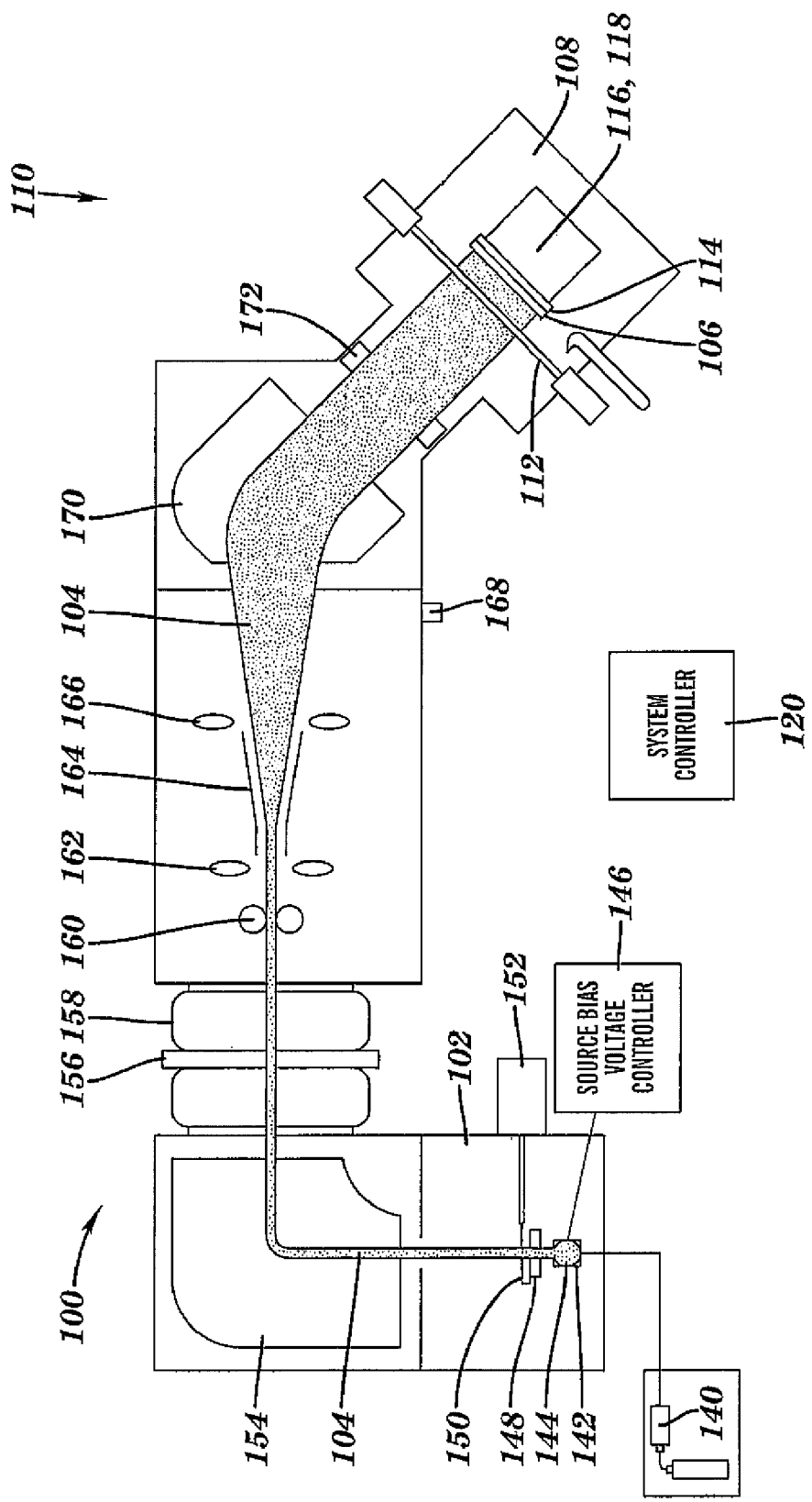
FIG. 1 shows a schematic view of an ion implanter system according to the disclosure.

A cathode for an ion source, the ion source and a related method are disclosed. As an introduction, FIG. 1 shows an illustrative ion implanter system 100 according to the disclosure. Implanter system 100 includes an ion beam generator 102 for generating and transmitting an ion beam 104 to a target 106 in an implant chamber 108. Ion beam generator 102 may be any now known or later developed ion beam generator such as those available from Varian Semiconductor Equipment Associates. Typically, target 106 includes one or more semiconductor wafers mounted to a platen 114. Characteristics of platen 114 and, hence, target 106, may be controlled by a platen drive assembly 116 that rotates the target 106, i.e., wafer, and a target vertical scan system position controller 118 that controls the vertical position of target 106. Drive assembly 116 and position controller 118 are both responsive to a system controller 120.

Besides the above-described components, ion beam generator 102 may include a gas flow 140; an ion source 142 including a source magnet 144 and a source bias voltage controller 146; a suppression electrode 148, an extraction electrode 150 and one or more manipulator motors 152 for electrodes 148, 150; an analyzer magnet 154; an accelerator focus electrode 156; an accelerator suppression electrode 158; a mass slit 160; a pre-scan suppression electrode 162; horizontal scan plates 164; a post-scan suppression electrode 166; a nitrogen ($N_2$) bleed 168; a corrector magnet 170; a limiting aperture 172; and a profiler system 112. Each of the above-described components is monitored by and responsive to system controller 120. Since operation of ion implanter system 100 is known, no further details are described herein.

Figure 2:
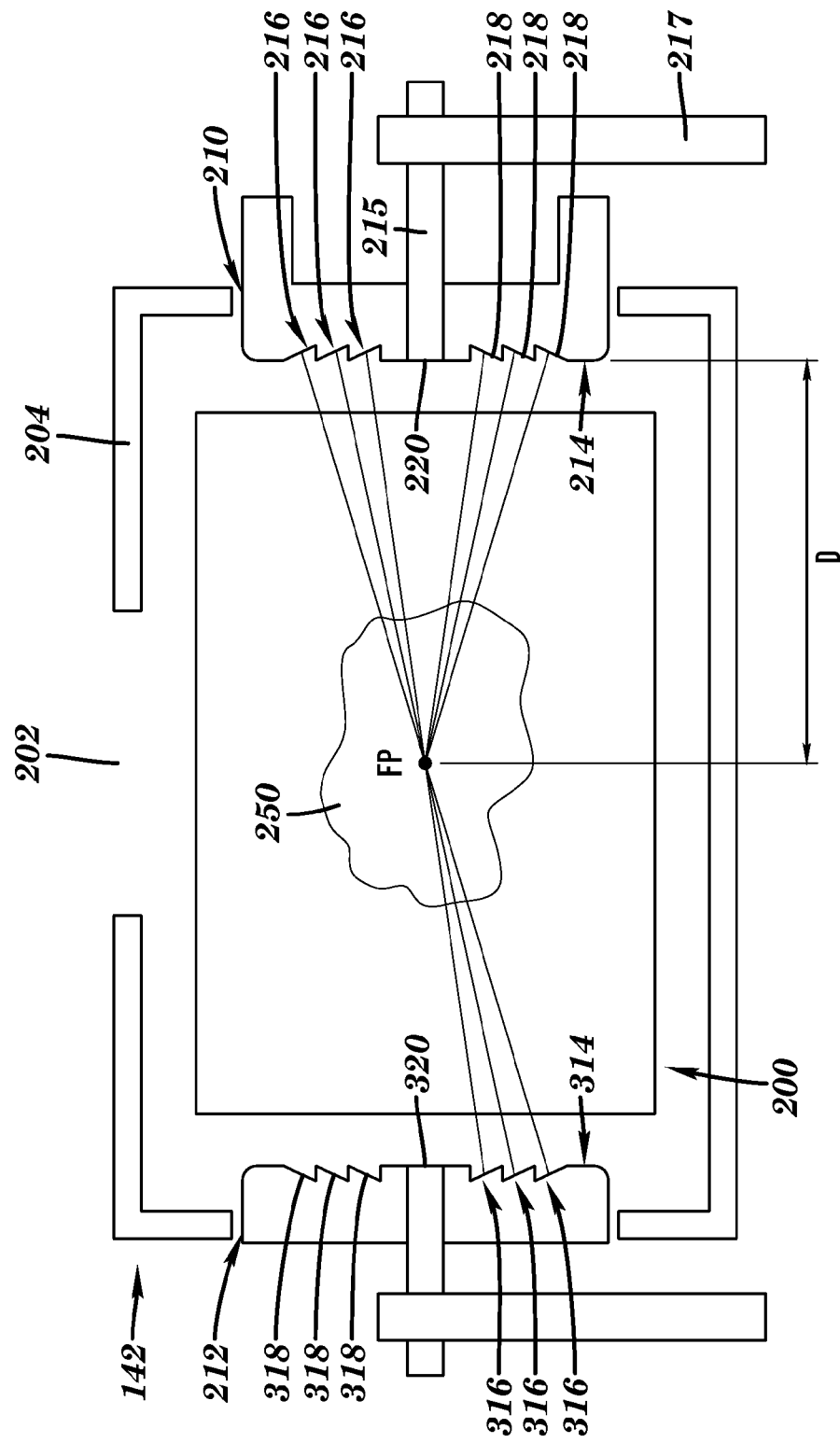
FIG. 2 shows a cross-sectional side view of an ion source according to the disclosure.
Figure 3:
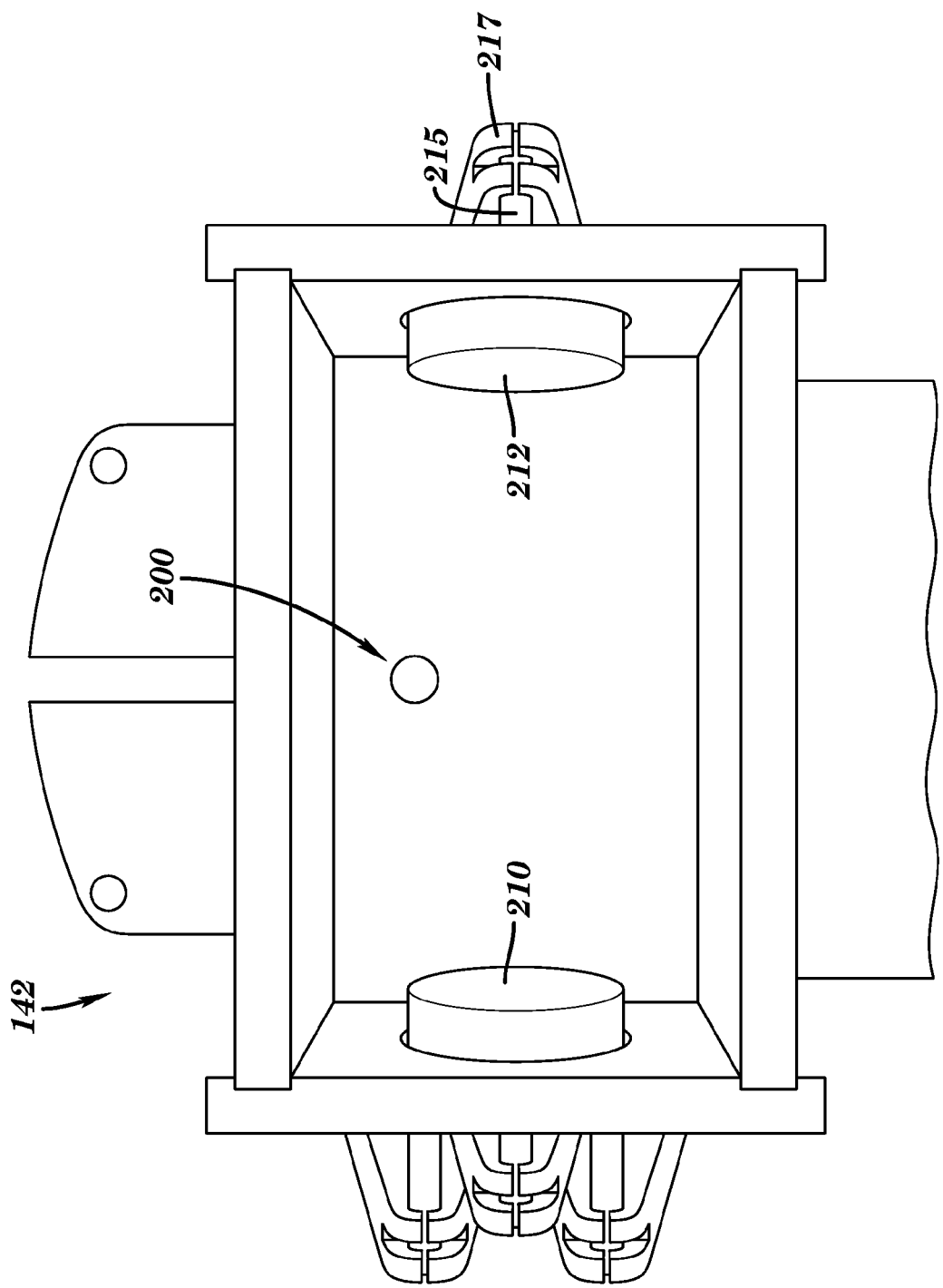
FIG. 3 shows a top view of the ion source of FIG. 2 with an ion plasma outlet cover removed.

Turning to ion source 142, according to one embodiment of the disclosure, as shown in FIGS. 2-3, ion source 142 includes a source gas inlet 200, e.g., coupled to gas flow 140 (FIG. 1), and an ion plasma outlet 202 (FIG. 2 only) in a cover 204. FIG. 2 shows a cross-sectional side view and FIG. 3 shows a top view with an ion plasma outlet cover removed. Ion source 142 also includes a cathode 210 and a repeller 212 for applying a bias to gas entering ion source 142 to create an ion plasma (not shown) that exits via ion plasma outlet 202.

Figure 4:
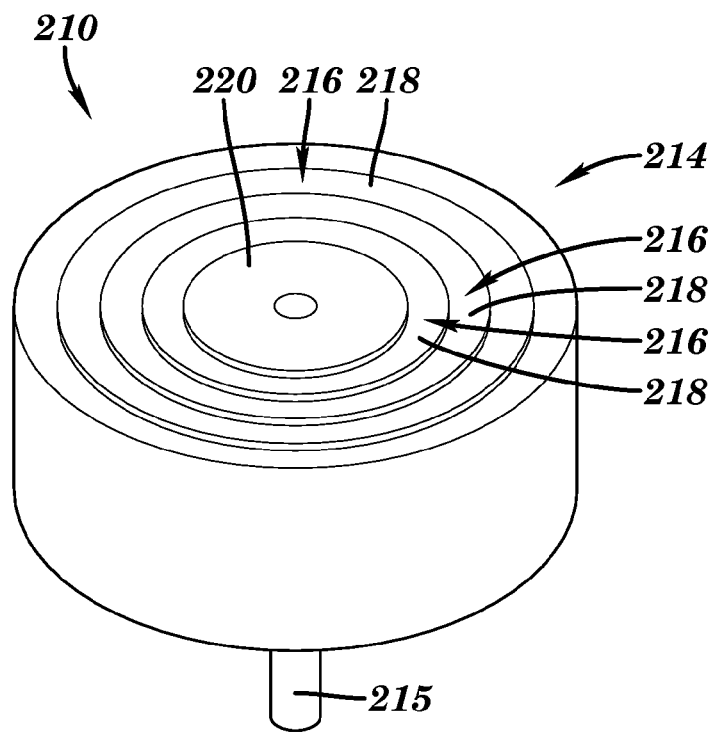
FIG. 4 shows an isometric view of a cathode according to the disclosure.
Figure 5:
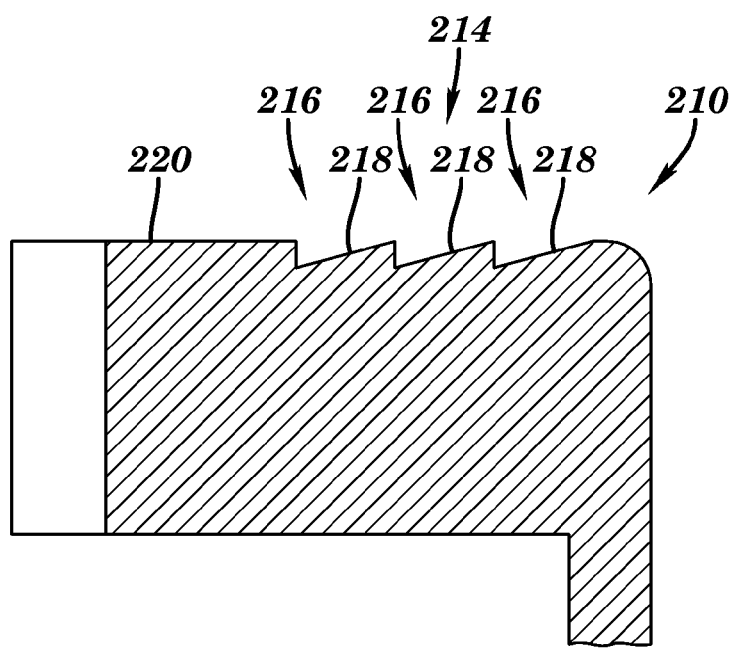
FIG. 5 shows a partial cross-sectional view of the cathode of FIG. 4.

As shown best in FIGS. 4 and 5, cathode 210 includes a working surface 214 having a plurality of electron production and focusing grooves 216 positioned therein. In FIGS. 4-5, electron production and focusing grooves 216 constitute substantially concentric grooves. A mount 215 is coupled to a back side of working surface 214 for coupling to a clamp 217 (FIG. 2) of ion source 142 (FIG. 2). FIG. 5 shows a partial cross-sectional view of cathode 210. Each of the plurality of electron production and focusing grooves 216 includes an angled surface 218 angled relative to a planar portion 220 of working surface 214. As shown in FIG. 2, angled surface 218 of each groove 216 faces a focal point FP at a distance D from working surface 214. That is, lines extending substantially perpendicular from each angled surface 218 intersect at focal point FP. Focal point FP may be adjacent to ion plasma outlet 202. In one embodiment, the angle of angled surface 218 of each groove 216 may be different, for example, such that they all face focal point FP, or to ensure angled surfaces 218 face focal point FP for the longest duration possible as cathode 210 ages. However, this is not necessary as the angle of angled surface 218 of each groove 216 may be substantially identical, e.g., for ease of manufacture. In addition, angled surfaces 218 need not be planar, as shown, and other arrangements (e.g., concave) that focus the plasma being generated may also be employed. In one embodiment, distance D may be approximately 30 mm from working surface 214. Of course, this distance may change depending on the dimensions of ion source 142.

Figure 6:
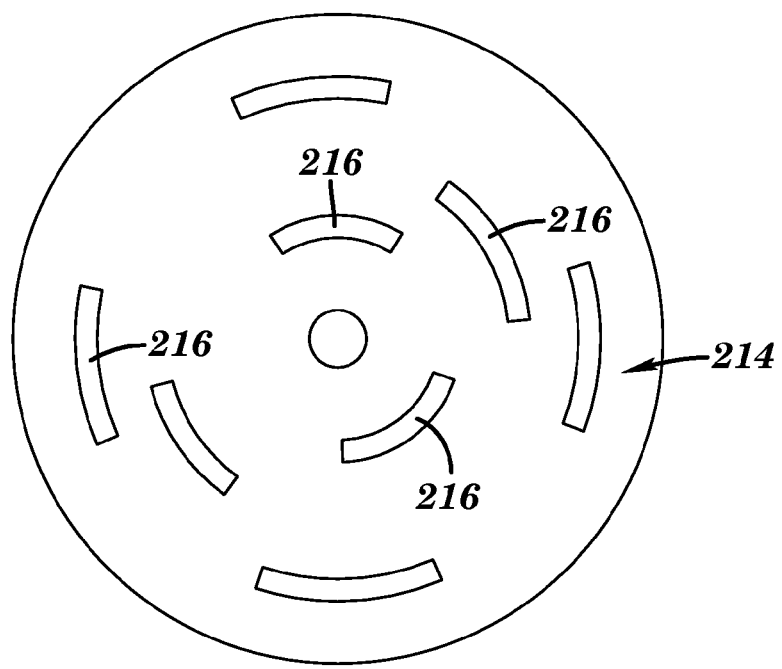
FIG. 6 shows a top view of an alternative embodiment of the cathode of FIGS. 4-5.

FIG. 6 shows an alternative embodiment in which electron production and focusing grooves 216 are not positioned in a substantially concentric manner, i.e., are not circular, and are discontinuous. Nonetheless, electron production and focusing grooves 216 of FIG. 6 provide substantially similar benefits as described herein. Although FIGS. 4-6 show a certain number of grooves 216, e.g., 3, it is understood that any number of grooves may be employed.

Figure 7:
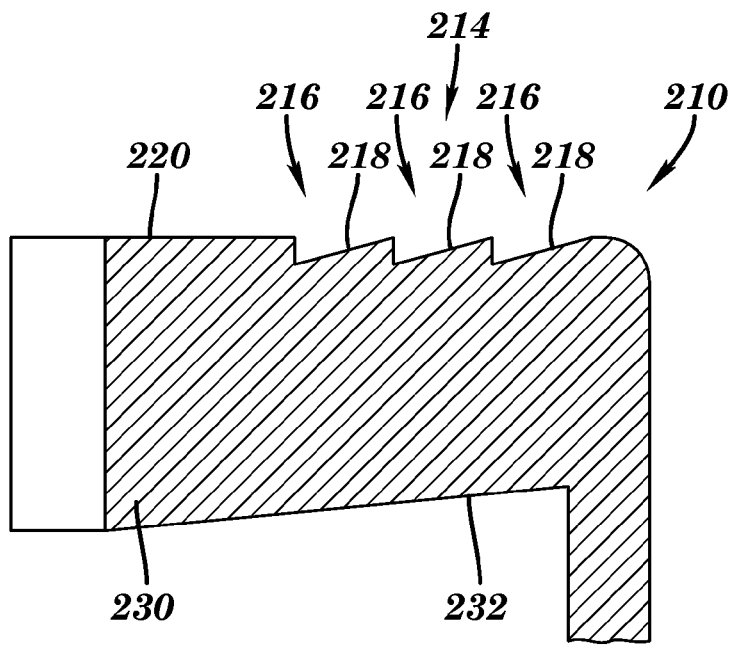
FIG. 7 shows a partial cross-sectional view of an alternative embodiment of the cathode of FIGS. 4-6.

In FIGS. 4 and 5, working surface 214 has a substantially uniform thickness. That is, other than grooves 216, the thickness is the same. Hence, the overall working surface has a substantially uniform thickness. FIG. 7 shows an alternative embodiment in which a central region 230 of working surface 214 is thicker than an outer region 232 of working surface 214.

Returning to FIG. 2, ion source 142 may also include a repeller 212 having substantially similar structure to cathode 210. That is, repeller 212 may have a working surface 314 having a plurality of electron focusing grooves 316 positioned therein. Each of grooves 316 of repeller 212 includes an angled surface 318 angled relative to a planar portion 320 of working surface 314 of repeller 212. In this case, angled surface 218, 318 of each groove 216, 316 may face focal point FP at distance D from working surfaces 214, 314 of cathode 210 and repeller 212.

In operation, an ion plasma 250 (FIG. 2) is generated using ion source 142. In particular, a source gas is provided via gas flow 140 (FIG. 1) to ion source 142. A bias is applied on cathode 210 adjacent to the source gas to generate the ion plasma. A bias is also applied on repeller 212 adjacent to the source gas so as to repel the electrons. In one embodiment, repeller 212 and cathode 210 are at the same potential, but this is not essential. Working surface 214 focuses the thermionic electrons in a central region of ion plasma 250, which increases output as if the working surface was concave. In this fashion, cathode 210 acts similarly to the Fresnel type of lens used in optical systems. However, cathode 210 does not suffer from a substantially thinner working surface 214 (as with an aging, initially-planar cathode), which would shorten it's life cycle. Cathode 210 may provide increased output in the range of approximately 40-50% compared to that of a perfectly planar cathode at the start of use. As cathode 210 is used, it will become concave, with the depth of grooves 216 diminishing over time.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. An ion source for an ion implanter, the ion source comprising:
    a source gas inlet;
    a cathode comprising a working surface having a plurality of electron production and focusing grooves positioned therein; and
    an ion plasma outlet, wherein each of the plurality of electron production and focusing grooves includes an angled surface angled relative to a planar portion of the working surface.

2. The ion source of claim 1, wherein the plurality of electron production and focusing grooves includes a plurality of substantially concentric grooves.

3. The ion source of claim 1, wherein the angle of the angled surface of each of the plurality of the grooves is substantially identical.

4. The ion source of claim 1, wherein the angled surface of each of the plurality of the grooves faces a focal point at a distance from the working surface.

5. The ion source of claim 4, wherein the distance is approximately 30 mm from the working surface.

6. The ion source of claim 4, wherein the focal point is adjacent to the ion plasma outlet.

7. The ion source of claim 1, wherein the working surface has a substantially uniform thickness.

8. The ion source of claim 1, further comprising a repeller having a working surface having a plurality of electron production and focusing grooves positioned therein.

9. The ion source of claim 8, wherein each of the plurality of electron focusing grooves of the repeller includes an angled surface angled relative to a planar portion of the working surface of the repeller.

10. The ion source of claim 9, wherein the angled surface of each of the plurality of the electron production and focusing grooves of the cathode and the repeller faces a focal point at a distance from the working surfaces of the cathode and the repeller.

11. The ion source of claim 10, wherein the focal point is adjacent to the ion plasma outlet.

12. An ion implanter system comprising the ion source of claim 1.

13. An ion source for an ion implanter, the ion source comprising:
    a source gas inlet;
    a cathode comprising a working surface having a plurality of electron production and focusing grooves positioned therein; and
    an ion plasma outlet wherein a central region of the working surface is thicker than an outer region of the working surface.

14. A method of generating an ion plasma, the method comprising:

provided a source gas;

applying a bias on a cathode adjacent to the source gas to generate the ion plasma, the cathode comprising a working surface having a plurality of electron production and focusing grooves positioned therein, wherein each of the plurality of electron production and focusing grooves includes an angled surface angled relative to a planar portion of the working surface.

15. The method of claim 14, wherein the angle of the angled surface of each of the plurality of the electron production and focusing grooves is substantially identical.

16. The method of claim 14, wherein the angled surface of each of the plurality of the grooves faces a focal point at a distance from the working surface.

17. The method of claim 16, wherein the distance is approximately 30 mm from the working surface.

18. The method of claim 14, wherein the working surface has a substantially uniform thickness.

19. The method of claim 14, further comprising applying a bias on a repeller adjacent to the source gas, the repeller comprising a working surface having a plurality of electron focusing grooves positioned therein.

20. A method of generating an ion plasma, the method comprising:

providing a source gas;

applying a bias on a cathode adjacent to the source gas to generate the ion plasma, the cathode comprising a working surface having a plurality of electron production and focusing grooves positioned therein, wherein a central region of the working surface is thicker than an outer region of the working surface.

* * * * *